United States Patent [19]

Takei et al.

[11] Patent Number: 4,952,390

[45] Date of Patent: Aug. 28, 1990

[54] SUPERCONDUCTIVE OXIDE CRYSTAL AND A PRODUCTION PROCESS THEREOF

[75] Inventors: Humihiko Takei, 12-3, Kitaurawa 5-chome, Urawa-shi Saitama-ken; Hiroyuki Takeya, Kawasaki, both of Japan

[73] Assignees: Humihiko Takei, Urawa; Ibiden Co., Ltd., Ogaki, both of Japan

[21] Appl. No.: 213,833

[22] Filed: Jun. 30, 1988

[30] Foreign Application Priority Data

Jul. 3, 1987 [JP] Japan .................................. 62-165226

[51] Int. Cl.$^5$ ................................................ C01G 1/00
[52] U.S. Cl. ........................................ 423/593; 505/1; 505/725
[58] Field of Search ..................... 423/593; 505/1, 725

[56] References Cited

PUBLICATIONS

Damento et al., "Preparaton of Single Crystals of Supercord . . . " Preprint of Paper submitted to Appl. Phys. Lett.

Hayashi et al., "Growth of $YBa_2Cu_3O_{9-\delta}$ Single Crystals . . ." Japanese Journal of Applied Physics vol. 26 No. 7 Jul. 1987 L1197–L1198.

Kawabe et al., "Single Crystal Growth of Superconductor Layered . . ." Proceedings of Symposiums 1987 Spring Meeting . . . 4/24/87.

Primary Examiner—Theodore Morris
Assistant Examiner—David W. Schumaker
Attorney, Agent, or Firm—Sherman and Shalloway

[57] ABSTRACT

This invention concerns a novel superconductive oxide crystal and a production process thereof, the novel superconductive oxide crystal comprising a superconductive oxide crystal composed of a rare earth element, an alkaline earth meal, copper, and oxygen, in which copper (II) oxide (CuO)) is dispersed like detached islands.

7 Claims, No Drawings

SUPERCONDUCTIVE OXIDE CRYSTAL AND A PRODUCTION PROCESS THEREOF

BACKGROUND OF THE INVENTION

1. Field of the Invention:

This invention relates to an oxide crystal showing superconductivity at high temperatures and a production process thereof. More particularly, it relates to a superconductive oxide crystal, the superconductivity of which is hardly affected by a magnetic field, and a production process thereof 2. Description of the Prior Art:

Recently, oxides showing superconductivity at the temperature of liquid nitrogen have been found. However, almost all of these oxides are susceptible to magnetic fields so that the great problem in their practical use is that their critical temperature, i.e. the temperature at which where their electric resistance falls to zero, decreases when they are placed in a weak magnetic field Accordingly, a need continues to exist to produce a good superconductive oxide crystal having a high critical temperature and to elucidate the mechanism of its superconductivity in order that the commercial production of such oxide crystals may be realized at the earliest possible time.

In this connection, the May 11, 1987 issue of a journal, Nikkei New Material, at page 80, carries a report on a process for the production of a superconductive oxide single crystal. According to the report, a powder material, to be made into a superconductive product, is heated to above 1000° C. in a platinum crucible to melt the material and then it is cooled slowly in order to let it grow into a single crystal. However, since the material is heated to above 1000° C. in a platinum crucible, the decomposition reportedly takes place above 950° C., and not only is the superconductivity of the product greatly reduced by contamination with platinum from the crucible, but, also the consumption of the precious metal is thought to bring about a great problem in commercial production. The report also points out that the critical temperature of the product is, in fact, very low.

As mentioned above, the fact is that a superior superconductive oxide crystal that has a high critical temperature and that is hardly affected by magnetic fields has not yet been produced when a conventional process is used.

Under the circumstances, the present inventors made intensive studies to eliminate drawbacks in conventional production processes and finally arrived at the present invention.

SUMMARY OF THE INVENTION

It is an object of this invention to provide a superior superconductive oxide crystal which has a high critical temperature which is hardly affected by a magnetic field.

This object is accomplished by the provision of a superconductive oxide crystal, characterized by including 100 parts by weight of a second superconductive oxide crystal composed of a rare earth element, an alkaline earth metal, copper, and oxygen, and 0.2–5.0 parts by weight of copper oxide, wherein said copper oxide is dispersed in said second superconductive oxide crystal, as copper (II) oxide (CuO), like detached islands; and by a production process for a superconductive oxide crystal, characterized by heating a mixture including a first oxide powder and a copper compound at 950–1400° C in an oxygen-containing gas with said mixture kept in contact with a second oxide composed mainly of a rare earth element, wherein said first oxide powder is composed of a rare earth element, an alkaline earth metal, copper, and oxygen.

DETAILED DESCRIPTION OF THE PREFERRED EMBODIMENT

In this invention, the rare earth element contained in the second superconductive oxide crystal is at least one element selected from the group consisting of Y, Nd, Sm, Eu, Gd, Dy, Ho, Er, Tm, Yb, Lu, and La,, and the alkaline earth metal contained in the second superconductive oxide crystal is at least one element selected from the group consisting of Ba, Ca, and Sr.

The chemical composition of the second superconductive oxide crystal can be, for example, $YBa_2Cu_3O_{6.5+x}$, $TmBa_2CuO_3O_{6.5+x}$, $(La_{1-x}Ba_x)_2CuO_{4-y}$ or $(La_{1-x}Sr_x)_2CuO_{4-y}$. Particularly, a superconductive oxide crystal represented by the general formula $RA_2Cu_3O_{6.5+x}$, wherein R stands for a rare earth element, and A stands for an alkaline earth metal, shows a superconducting critical temperature as high as 90° K.

An objective superconductive oxide crystal of this invention is required to comprise 100 parts by weight of the second superconductive oxide crystal and 0.2–5.0 parts by weight of copper oxide. The reason that more than the theoretical amount of copper oxide must be used comes from the fact that the second superconductive oxide crystal undergoes a decomposition

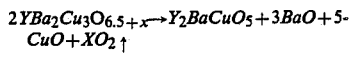

at elevated temperatures above 950° C., and liberates an insulating product with the result that superconductive properties, in terms of the critical temperature or critical current density, decline greatly. That is to say, a good superconductivity can be imparted to the objective superconductive oxide crystal by the addition of an excess amount of copper oxide to the second superconductive oxide crystal because the above-mentioned decomposition reaction is brought under control.

Incidentally, when the content of added copper oxide in the second superconductive oxide crystal is less than 0.2 parts by weight on the basis of 100 parts by weight of the second superconductive oxide crystal, the decomposition reaction cannot be well controlled; and, as a result, the entire superconductivity declines. Contrary to this, when the content of added copper oxide in the second superconductive oxide crystal exceeds 5.0 parts by weight on the basis of 100 parts by weight of the second superconductive oxide crystal, there increasingly appear non-superconductive regions in the oxide crystal, and they lower the superconductivity of the oxide crystal. For these reasons, the content of added copper oxide in the second superconductive oxide crystal has to be in the range 0.2–5.0 parts by weight on the basis of 100 parts by weight of the second superconductive oxide crystal. In this respect, when it is in the range 0.3–2.0 parts by weight on the basis of 100 parts by weight of the second superconductive oxide crystal, there favorably appears excellent superconductivity.

The added copper oxide, according to this invention, exists in the second superconductive oxide crystal as copper (II) oxide (CuO) crystal and is dispersed like islands, each of which is isolated from one another so as not to divide any part of the matrix second superconductive oxide crystal. The copper oxide is scattered in such an isolated way that the continuity of the second superconductive oxide crystal is never interrupted completely. Thus, the objective superconductive oxide crystal can give rise to a good superconductivity, even at elevated critical temperatures, which is not affected by magnetic fields. The dispersed copper oxide crystal not only does not unfavorably influence the superconductivity to be expected, but, also helps control the decomposition reaction of the second superconductive oxide crystal. Thus, a good superconductivity, the high critical temperature of which is hardly affected by magnetic fields, can be obtained.

Oxide powder composed of a rare earth element, an alkaline earth metal, copper, and oxygen, which is used for the second superconductive oxide crystal of this invention, can be prepared by various processes, such as (1) mixing oxide or carbonate powders of a rare earth element, an alkaline earth metal, and copper, respectively, by a prescribed amount, and calcining the powder mixture; (2) mixing nitrate or chloride aqueous solutions of a rare earth element, an alkaline metal, and copper, respectively, by a prescribed amount, and calcining the precipitate appearing upon the addition of oxalic acid to the solution mixture, after filtration; or (3) mixing alkoxide solutions of a rare earth element, an alkaline earth metal, and copper, respectively, by a prescribed amount, adding water thereto so as to polycondense them by hydrolysis, and calcining the gelatinous substance appearing therefrom, wherein the above mentioned amount of the each element is desirable to be in proximity to a theoretical composition from which the second superconductive oxide crystal can be obtained. Also, the calcination of the above-mentioned processes is preferably carried out at 550° C. and above, because if it is done below 550° C., each of the elements can hardly diffuse into one another, which makes it difficult to produce an oxide powder of uniform composition.

Furthermore, according to this invention, a copper compound has to be mixed in the oxide powder. The reason for mixing a copper compound comes from the fact that the copper compound is converted into copper (II) oxide (CuO) in the oxide powder, by heating, and the CuO effectively prevents the oxide powder from decomposing and forming an insulating substance harmful to superconductivity. Therefore, the copper compound may be a copper oxide or a copper compound that turns into CuO in an oxygen-containing gas by heating. In this respect, at least one compound selected from the group consisting of copper naphthenate, copper oleate, copper gluconate, copper acetate, copper formate, copper (II) hydroxide, copper nitrate, copper chloride, copper carbonate, various copper alkoxides and hydrolyzed products resulting from the hydrolysis of copper alkoxides can be employed as the copper compound of this invention.

When the ratio of the copper compound to the oxide powder is less than 25:100 (parts by weight), converted into CuO, the decomposition reaction of the second superconductive oxide crystal to produce an insulating substance cannot be controlled in a desired manner, with the result that the superconductivity of the objective superconductive oxide crystal declines. Also, when the ratio of the copper compound to the oxide powder is more than 400:100 (parts by weight), converted into CuO, not all of the copper compound is absorbed in the second oxide composed mainly of a rare earth element; thus, so much of it remains in the second superconductive oxide crystal as non-superconductive CuO particle that the entire superconductivity is lowered in the end.

In view of the above, the amount of copper compound added has to be in the range 25–400 parts by weight per 100 parts by weight of the oxide powder. In this respect, when it is in the range 50–300 parts by weight per 100 parts by weight of the oxide powder, superior superconductivity can be imparted to the objective superconductive oxide crystal.

According to this invention, the oxide powder and the copper compound are required to be heated in an oxygen-containing gas while being kept in touch with the second oxide composed mainly of a rare earth element. In advance of heating, the mixture is desirably molded into a cylindrical shape or the like. The reason for heating the mixture in contact with the second oxide composed mainly of a rare earth element stems from the fact that almost all of the extra copper oxide is absorbed in the second oxide in such a way as to form a stable compound, whereby not too many CuO crystal islands are left in the second superconductive oxide crystal.

Incidentally, the term "oxide mainly composed of a rare earth element" is intended herein to mean an oxide including at least one rare earth element selected from the group consisting of Y, Nd, Sm, Eu, Gd, Dy, Ho, Er, Tm, Yb, Lu, and La as a major component. When the mixture comprising the oxide powder and the copper compound is heated, while being kept in contact with a second oxide, the molded mixture can be placed on a press-molded oxide disc and heated together, or the molded mixture can be placed on a powdery oxide laid on a refractory mold and heated together, for example.

The heating atmosphere has to contain oxygen gas in order to adjust the content of oxygen in the second superconductive oxide crystal. For this reason, it may be pure oxygen or a mixture of oxygen with argon, helium, nitrogen or the like. Therefore, air can also be used for this purpose. In any case, however, it is desirable to contain 50–100 percent of oxygen.

The heating temperature is required to be maintained in the range 950°–1400° C. This is so because when it is lower than 950° C., the oxide powder does not melt so well as to form a good crystal and the superconductivity of the objective product declines, accordingly; and when it is higher than 1400° C., the oxide powder decomposes and part of the elements constituting the mixture is lost and the composition gets out of the prescription, which results in the declining of the entire superconductivity.

After the mixture is allowed to melt at 950°–1400° C. and crystallize, it is desirably cooled at a rate of 60° C. an hour and below, in an oxygen-containing atmosphere. Also, after being cooled, it can be heated again in an oxygen-containing atmosphere.

This invention will be described in more detail with reference to the following examples; however, the sole example is intended to illustrate the invention and not to be construed to limit the scope of the invention.

EXAMPLE (1) Powdered yttrium oxide of the purity 99.9% available on the market, powdered barium carbonate of the purity 99.9%, and powdered copper (II) oxide of the purity 99.9% are weighed out respectively, at 100, 332, and 201 parts by weight. They are well mixed with one another, molded into a pellet, and heated at 700° C. for 10 hours in air.

(2) The pellet is powdered by the use of a mortar. One hundred parts by weight of the powder and 200 parts by weight of copper (II) oxide are mixed well.

(3) Some of the powder mixture prepared in (2) is taken and molded into a cylindrical shape, 10 mm across and 20 mm long.

(4) Some of the powdered yttrium oxide in (1) is molded into a discal shape.

(5) The mixture molded into cylindrical shape is placed on the yttrium oxide molded into a discal shape. They are put in a tubular oven, with a 100% oxygen kept flow. They are heated from room temperatures to 1150° C. at a rate of 300° C. an hour. The temperature is maintained at 1150° C. for 4 hours, and then lowered at a rate of 20° C. an hour. A 1×1×3 millimeter superconductive oxide crystal is obtained. The superconductivity of the oxide crystal is determined in terms of its critical temperature by the direct-current four terminal method, with the intensity of the magnetic field being varied, perpendicular to the crystal axis C. Table 1 shows the result.

COMPARATIVE EXAMPLE

Without blending any copper compound, the powdered mixture is converted into a superconductive oxide crystal in the same way as in the above example. Its superconductivity is also given in Table 1.

As a result of x-ray powder diffraction and EPMA analysis of a superconductive oxide crystal prepared by this invention, 1.1 part by weight of copper (II) oxide (CuO) proves to be found in 100 parts by weight of the second superconductive oxide crystal, the CuO dispersed like islands.

As best seen from Table 1, the objective superconductive oxide crystal of this invention shows a high critical temperature that does not fall so readily, even when a strong magnetic field is impressed, while the comparative superconductive oxide crystal that does not contain an excess amount of copper oxide shows a very low critical temperature that falls readily, even when a weak magnetic field is impressed.

TABLE 1

| Intensity of the magnetic field impressed (KOe) | Critical temperature (°K.) | |
|---|---|---|
| | Example | Comparative Example |
| 0 | 91 | 58 |
| 3 | 90 | 49 |
| 10 | 89 | 44 |
| 20 | 89 | 42 |
| 40 | 88 | 40 |
| 60 | 87 | 37 |

TABLE 1-continued

| Intensity of the magnetic field impressed (KOe) | Critical temperature (°K.) | |
|---|---|---|
| | Example | Comparative Example |
| 90 | 86 | 35 |

As the above example clearly teaches, the superconductive oxide crystal of this invention is provided with a high critical temperature, which is not affected so readily by the magnetic field impressed. Therefore, it can serve not only as a practically valuable material in various industrial fields including electronics but also as a very useful material for studying the mechanism of superconductivity at elevated temperatures.

What is claimed is:

1. A process for the production of a superconductive oxide crystal comprising the steps of:
    mixing a copper compound with a first complex oxide powder, said first complex oxide powder comprising a rare earth element, an alkaline earth metal, copper and oxygen in proportions corresponding substantially to the theoretical composition of a superconductive oxide crystal;
    heating the mixture of said copper compound with said first complex oxide powder at a temperature in the range of from 950° C. to 1400° C. in an oxygen-containing atmosphere while contacting said mixture of said copper compound and said first complex oxide powder with a second oxide, said second oxide comprising substantially a rare earth oxide.

2. The process according to claim 1, wherein said first complex oxide powder is calcined prior to being mixed with said copper compound.

3. The process according to either one of claim 1 or 2, wherein said copper compound is selected from the group consisting of copper oxide and a compound convertible into CuO upon heating in an oxygen-containing atmosphere.

4. The process according to claim 3, wherein said compound convertible into CuO upon heating in an oxygen-containing atmosphere is an organic copper compound.

5. The process according to either one of claims 1 or 2 wherein said copper compound is mixed with said first oxide powder in an amount of 25–400 parts by weight, converted into copper (II) oxide (CuO), per 100 parts by weight of said first complex oxide powder.

6. The process according to claim 3 wherein said copper compound is mixed with said first complex oxide powder in an amount of 25–400 parts by weight, converted into copper (II) oxide (CuO), per 100 parts by weight of said first complex oxide powder.

7. The process according to claim 4 wherein said copper compound is mixed with said first complex oxide powder in an amount of 25–400 parts by weight, converted into copper (II) oxide (CuO), per 100 parts by weight of said first complex oxide powder.

* * * * *